(12) United States Patent
Lin et al.

(10) Patent No.: US 10,147,603 B2
(45) Date of Patent: Dec. 4, 2018

(54) METHOD OF MANUFACTURING A FET USING A TWO DIMENSIONAL TRANSITION METAL DICHALCOGENIDE INCLUDING A LOW POWER OXYGEN PLASMA TREATMENT

(71) Applicants: TAIWAN SEMICONDUCTOR MANUFACTURING CO., LTD., Hsinchu (TW); National Taiwan University, Taipei (TW)

(72) Inventors: Shih-Yen Lin, Hsinchu (TW); Chi-Wen Liu, Hsinchu (TW); Si-Chen Lee, Taipei (TW); Chong-Rong Wu, New Taipei (TW); Kuan-Chao Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/197,004

(22) Filed: Jun. 29, 2016

(65) Prior Publication Data

US 2018/0005824 A1  Jan. 4, 2018

(51) Int. Cl.
*H01L 21/336* (2006.01)
*H01L 21/02* (2006.01)
(Continued)

(52) U.S. Cl.
CPC .. *H01L 21/02568* (2013.01); *H01L 21/02694* (2013.01); *H01L 21/324* (2013.01); *H01L 29/66742* (2013.01)

(58) Field of Classification Search
CPC ......... H01L 21/02568; H01L 21/02694; H01L 21/324
(Continued)

(56) References Cited

U.S. PATENT DOCUMENTS

2007/0079750 A1* 4/2007 Miguez ................. B82Y 20/00
                                                      117/68
2013/0233382 A1* 9/2013 Kobayashi ........ H01L 31/03923
                                                      136/256
(Continued)

OTHER PUBLICATIONS

Lingming Yang et al., "High-Performance MoS2 Field-Effect Transistors Enabled by Chloride Doping: Record Low Contact Resistance (05.kΩ⁻µ m) and Record High Drain Current (460 µ A/µ m)", 2014 Symposium on VLSI Technology Digest of Technical Papers, 2014, 2 pgs.
(Continued)

*Primary Examiner* — Caleb Henry
(74) *Attorney, Agent, or Firm* — McDermott Will & Emery LLP

(57) ABSTRACT

In a method of fabricating a field effect transistor, a Mo layer is formed on the substrate. The Mo layer is sulfurized to convert it into a $MoS_2$ layer. Source and drain electrodes are formed on the $MoS_2$ layer. The $MoS_2$ layer is treated with low-power oxygen plasma. A gate dielectric layer is formed on the $MoS_2$ layer. A gate electrode is formed on the gate dielectric layer. An input electric power in the low-power oxygen plasma treatment is in a range from 15 W to 50 W.

20 Claims, 7 Drawing Sheets

(51) Int. Cl.
*H01L 21/324* (2006.01)
*H01L 29/66* (2006.01)

(58) Field of Classification Search
USPC .......................................................... 438/285
See application file for complete search history.

(56) References Cited

U.S. PATENT DOCUMENTS

| | | | |
|---|---|---|---|
| 2015/0255661 A1* | 9/2015 | Liang | H01L 31/18 438/95 |
| 2015/0294875 A1* | 10/2015 | Khondaker | H01L 21/02175 257/411 |
| 2016/0016796 A1* | 1/2016 | Hersam | C04B 35/522 423/290 |
| 2016/0093491 A1* | 3/2016 | Choi | H01L 21/02485 438/151 |
| 2016/0240692 A1* | 8/2016 | Shepard | H01L 29/45 |
| 2017/0062229 A1* | 3/2017 | Nealey | H01L 21/3081 |
| 2017/0101428 A1* | 4/2017 | Wang | C07F 11/005 |
| 2017/0194144 A1* | 7/2017 | Duan | H01L 21/02628 |

OTHER PUBLICATIONS

Chong-Rang Wu et al., "Multilayer MoS2 prepared by one-time and repeated chemical vapor depositions: anomalous Raman shifts and transistors with high On/Off ratio", Journal of Physics D: Applied Physics 48 (2015), pp. 1-7.
Narae Kang et al., "Photoluminescence Quenching in Single-Layer MoS2 via Ozygen Plasma Treatment", The Journal of Physical Chemistry, 2014, 118, p. 21258-2163.

\* cited by examiner

METHOD OF MANUFACTURING A FET USING A TWO DIMENSIONAL TRANSITION METAL DICHALCOGENIDE INCLUDING A LOW POWER OXYGEN PLASMA TREATMENT

TECHNICAL FIELD

The disclosure relates to field effect transistors (FETs) using two-dimensional (2D) material and method for manufacturing the same, and more particularly to FETs using transition metal dichalcogenide (TMD) and methods for manufacturing the same.

BACKGROUND

Graphene, as a two-dimensional (2-D) material, has emerged as a possible material for transistor applications in a sub-10 nm technology node. However, due to its zero-bandgap nature, a low ON/OFF ratio of graphene transistors has limited its practical applications. Other 2-D materials with bandgaps, such as transition metal dichalcogenide (TMD), have attracted attention for transistor applications.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device/apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1:
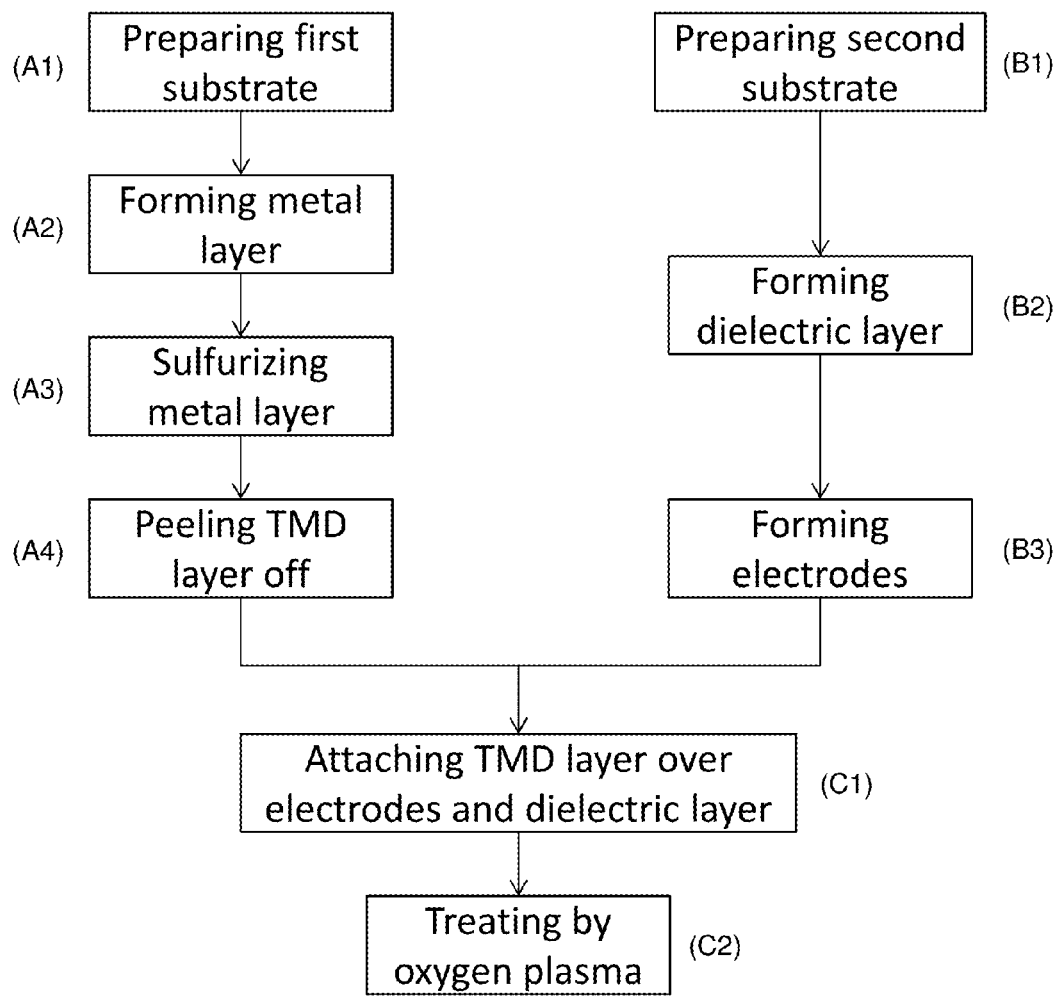
FIG. 1 shows an exemplary flow chart illustrating sequential manufacturing operations for an FET using a TMD material according to one embodiment of the present disclosure.
Figure 2A:
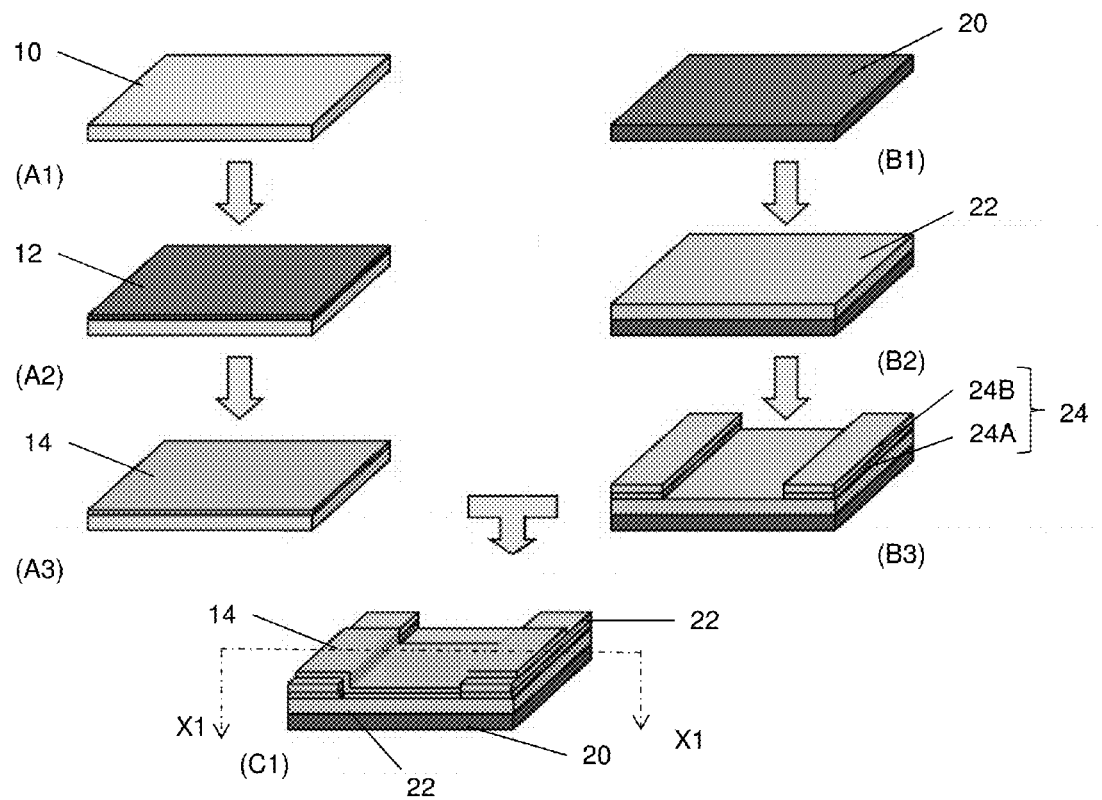
FIG. 2A shows exemplary schematic views illustrating sequential manufacturing operations for an FET using a TMD material according to one embodiment of the present disclosure.

FIG. 1 shows an exemplary flow chart illustrating sequential manufacturing operations for an FET using a TMD material according to one embodiment of the present disclosure. FIG. 2A shows exemplary schematic views corresponding to FIG. 1. It is understood that additional operations can be provided before, during, and after processes shown by FIG. 1, and some of the operations described below can be replaced or eliminated, for additional embodiments of the method. The order of the operations/processes may be interchangeable.

The TMD material includes, for example, $MoS_2$ or $WS_2$. In the following embodiments, $MoS_2$ is used as the TMD material. The manufacturing operations shown in FIGS. 1 and 2A includes three parts, Flow A (A1-A4), Flow B (B1-B3) and Flow C (C1 and C2).

In Flow A, a TMD (e.g., $MoS_2$) layer is prepared. In operation A1, a first substrate 10 (see, FIG. 2A) is prepared. The first substrate is a sapphire substrate in one embodiment. Other crystalline materials, such as Si, SiC, SiGe or GaAs, may be used as the first substrate 10.

In operation A2, a metal layer 12 (Mo in this embodiment) is formed on the first substrate 10. The metal layer 12 may be formed by physical vapor deposition, such as an RF sputtering method. A thickness of the metal layer 12 is in a range from about 0.5 nm to about 2 nm in some embodiments, and in a range from about 0.8 nm to about 1.2 nm in other embodiments. In one example, Mo layer having a 1.0 nm thickness is formed on the sapphire substrate.

In operation A3, the metal layer 12 is sulfurized. After the metal formation A2, the first substrate with the metal layer 12 is placed in a hot furnace for sulfurization. Sulfur powder, as a sulfur source, is placed on the upstream of the gas flow, and is evaporated by heating. Evaporated sulfur flows with a carrier gas flow to the substrate and reacts with the metal layer 12, thereby forming a TMD layer 14. The evaporation temperature for the sulfur powder is maintained at a temperature in a range from about 110° C. to 130° C. Inert gas, such as Ar, He, and/or $N_2$, is used as the carrier gas. During the sulfurization operation, the substrate 10 is maintained at a temperature in a range from about 700° C. to 900° C. in some embodiments. The sulfurization is performed for about 20 min to about 40 min in some embodiments.

Figure 3A:
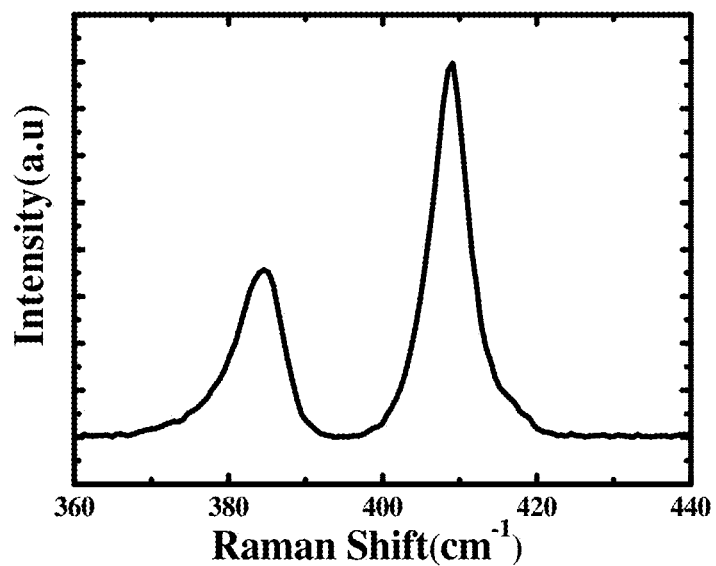
FIG. 3A shows a Raman spectrum of the $MoS_2$ layer and FIG. 3B shows a TEM (transmission electron microscope) cross sectional image of the $MoS_2$ layer, which is formed according to one embodiment of the present disclosure.
Figure 3B:
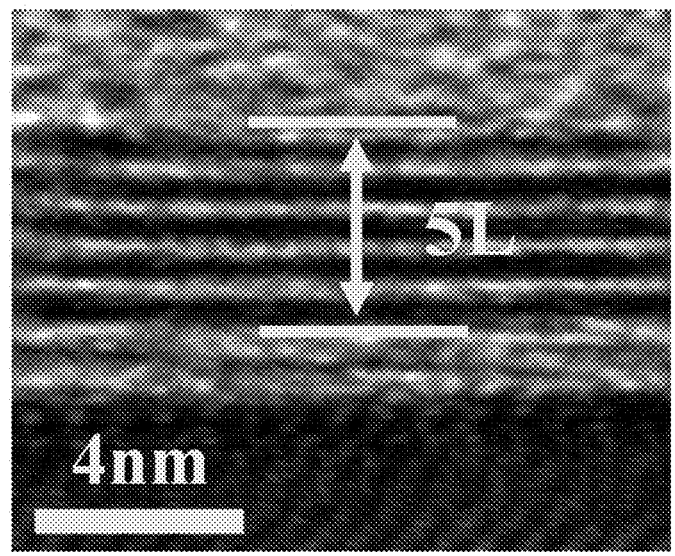

FIG. 3A shows a Raman spectrum of the $MoS_2$ layer and FIG. 3B shows a TEM (transmission electron microscope) cross sectional image of the $MoS_2$ layer, which is formed according to one embodiment of the present disclosure.

In the Raman spectrum of the $MoS_2$ film 14 as shown in FIG. 3A, there are two characteristic peaks. As shown in FIG. 3A, the Raman peak difference (ΔK) for the $MoS_2$ film 14 as grown is 24.9 $cm^{-1}$, which suggests that a number of 2D layers of $MoS_2$ is about 5. This is also confirmed by the TEM image of FIG. 3B. As shown in FIG. 3B, a clear 5-layered $MoS_2$ film is obtained. The number of layers depends upon the initial thickness of the metal (Mo) layer 12 and/or an amount of sulfur vaporized in the furnace.

In some embodiments, after the sulfurization A3, the operations of A2 (metal deposition) and A3 (sulfurization) are repeated to obtain a thicker $MoS_2$ layer. In other embodiments, different TMD layers are stacked. For example, a TMD stack including $WS_2/MoS_2/WS_2$ or $MoS_2/WS_2/MoS_2$ may be formed by repeating metal deposition sulfurization with different metals.

After the sulfurization operation A3, the TMD layer 14 is detached (peeled off) from the first substrate 10, in operation A4. The details of the operation A4 will be described with respect to FIGS. 4A-4E.

In Flow B, a basis transistor structure is formed. In operation B1, a second substrate 20, which is made of a conductive material, is prepared. The second substrate 20 becomes a gate electrode of an FET. In one embodiment, a p-type Si substrate is used as the second substrate 20. An n-type Si, polysilicon or amorphous silicon may be used as the second substrate 20.

In operation B2, a dielectric layer 22 is formed on the second substrate 20. The dielectric layer becomes a gate dielectric layer of the FET. In one embodiment, silicon dioxide is used as the dielectric layer 22. Other dielectric materials, such as SiON, SiN or $Al_2O_3$, may be used as the dielectric layer 22. A thickness of the dielectric layer 22 is in a range from about 50 nm to about 400 nm in some embodiments, and is in a range from about 100 nm to about 200 nm in other embodiments. The dielectric layer 22 may be formed by chemical vapor deposition (CVD), atomic layer deposition (ALD), or PVD.

After the dielectric layer 22 is formed, in operation B3, source and drain electrodes 24 of the FET are formed on the dielectric layer 22. The source and drain electrodes 24 are made of one or more layers of metal material. In some embodiments, the source and drain electrodes 24 are formed by stacked metal layers of a Ti layer 24A and an Au layer 24B formed on the Ti layer. In certain embodiments, the thickness of the Au layer is in a range from about 30 nm to about 70 nm and the thickness of the Ti layer is in a range from about 3 nm to about 10 nm. Instead of Au, other metals, such as Ag, Al or Cu may be used. The one or more metal layers for the source and drain electrodes 24 may be formed by PVD, CVD or ALD.

After the one or more metal layers for the source and drain electrodes 24 are formed, the one or more metal layers are patterned by lithography and etching operations into source and drain electrodes 24, as shown in FIG. 2A (B3).

Figure 2B:
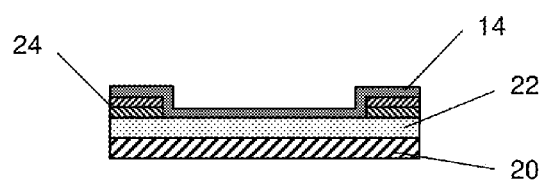
FIG. 2B shows an exemplary cross sectional view along line X1-X1 of FIG. 2A.

After the operations A4 and B3, the detached TMD layer 14 is transferred to the second substrate 20 with the dielectric layer 22 and the source and drain electrodes 24, in operation C1 as shown in FIGS. 1 and 2A. Further, the transferred TMD layer 14 is patterned by lithography and etching operations into a desired shape, thereby obtaining an FET structure, in which the TMD layer 14 functions as a channel layer. FIG. 2B shows an exemplary cross sectional view along line X1-X1 of FIG. 2A.

FIGS. 4A-4E shows detailed operations of detaching the TMD layer 14 from the first substrate and transferring the detached TMD layer 14 to the second substrate 20.

Figure 4A:
FIGS. 4A-4E shows exemplary cross sectional view illustrating sequential manufacturing operations for an FET using a TMD material according to one embodiment of the present disclosure.
Figure 4B:
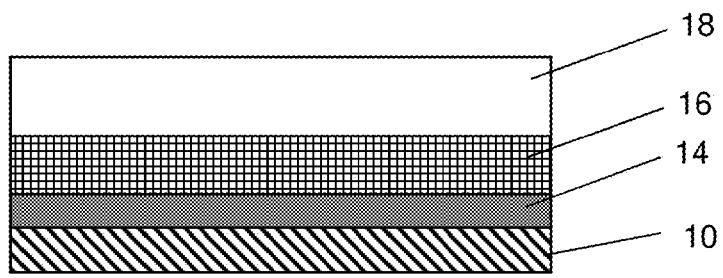

FIG. 4A shows a structure after the sulfurization as set forth above. As shown in FIG. 4B, a metal layer 16 is formed on the TMD layer 14 and an organic material layer 18 is further formed on the metal layer 16. In certain embodiments, the metal layer 16 is Cu with a thickness in a range from about 200 nm to about 400 nm, and the organic material layer 18 is PMMA (polymethylmethacrylate) with a thickness in a range from about 400 nm to about 600 nm.

Figure 4C:
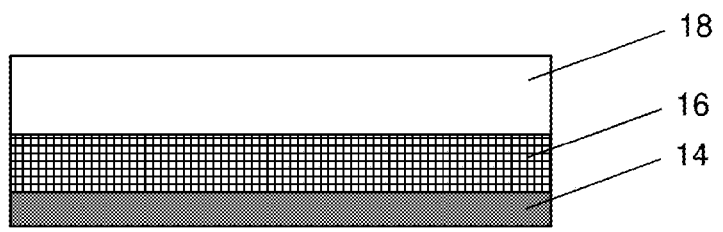

Subsequently, the structure of FIG. 4C is immersed in deionized water and the first substrate is detached. Ultrasonic vibrations may be applied to the water.

Figure 4D:
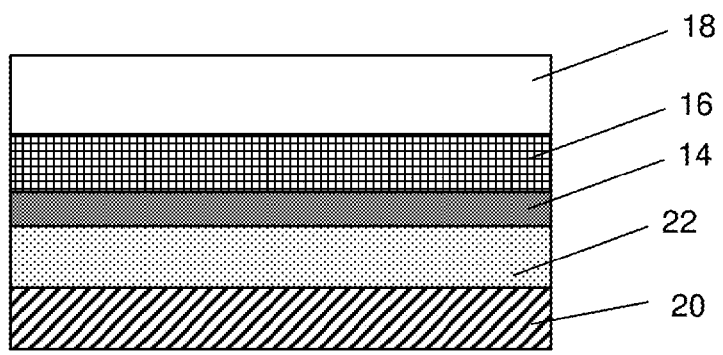

The detached TMD layer 14 supported by the metal layer 16 and the organic layer 18 is attached to the second substrate 20 with the dielectric layer 22 and the source and drain electrodes, as shown in FIG. 4D. In FIG. 4D, the source and drain electrodes 24 are omitted for simplicity.

Figure 4E:
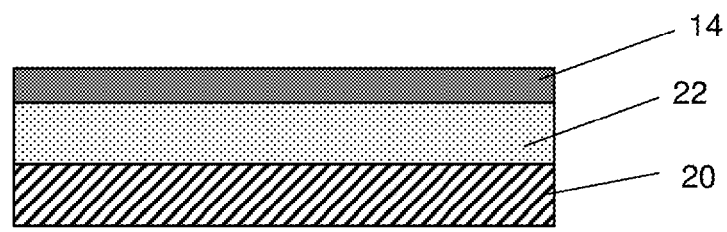

Then, the metal layer 16 and the organic layer 18 are removed, as shown in FIG. 4E. The organic layer 18 may be removed by using a solvent, such as acetone. In this embodiment, the Cu layer 16 is removed by using $FeNO_3$ solution.

After the TMD layer 14 is transferred to the second substrate and patterned, the FET structure with the TMD layer 14 is subjected to a plasma treatment, in operation C2 of FIG. 1. In one embodiment of the present disclosure, oxygen plasma is used.

The FET structure with the TMD layer 14 is treated by low-power oxygen plasma. The apparatus for generating the oxygen plasma includes an RF plasma apparatus, an ECR (electron cyclotron resonance) plasma apparatus, a CCP (capacitively coupled plasma) apparatus, an ICP (induction coupling plasma) apparatus or a remote-plasma apparatus. In one embodiment, an ICP-RF plasma apparatus is used. The input electric power is in a range from about 15 W to about 50 W, in some embodiments, and is in a range from about 20 W to 35 W in other embodiments. The time duration of the oxygen plasma treatment is in a range from about 1 sec to about 20 sec in some embodiments, and is in a range from about 3 sec to about 10 sec in other embodiments. In certain embodiments, a DC bias in a range from about 20 V to about 40 V is applied to the sample holder, on which the second substrate 20 is disposed. The oxygen plasma treatment decreases defects in the $MoS_2$ layer.

Figure 5A:
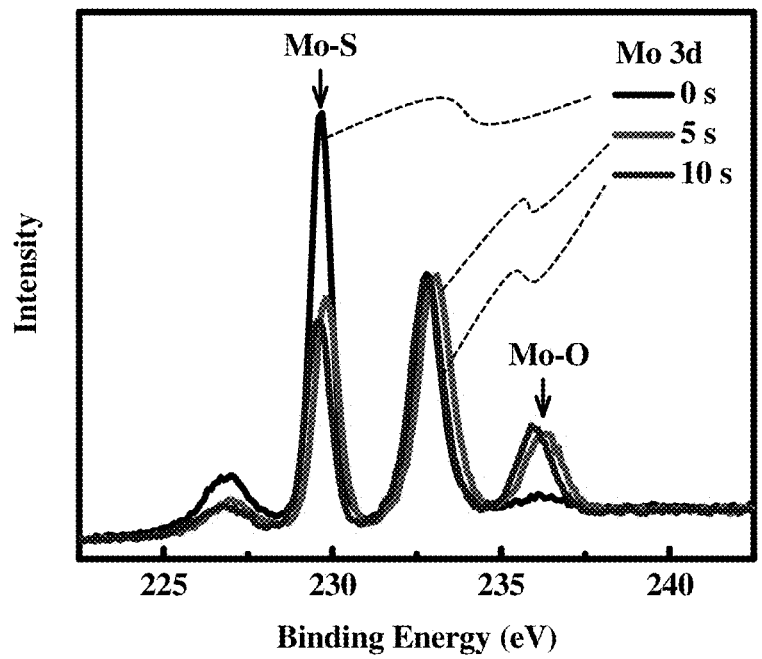
FIG. 5A shows XPS (X-ray photoelectron spectroscopy) spectra of $MoS_2$ layers.

FIG. 5A shows XPS (X-ray photoelectron spectroscopy) spectra of $MoS_2$ layers made by different conditions, as the TMD layer 14. FIG. 5A shows three spectra corresponding to different plasma treatment time, 0 sec, 5 sec and 10 sec, respectively.

By the low-power oxygen treatment, the peak relating to the Mo—O bond increases, while the peak relating to the Mo—S bond decreases. According to the XPS curves, after the oxygen plasma treatment, the amount of Mo—O bonds increases, which suggests that the $MoS_2$ film has been converted to $MoS_xO_y$. It is estimated that the oxygen composition should be between 1-5 atomic percent after the plasms treatment.

Figure 5B:
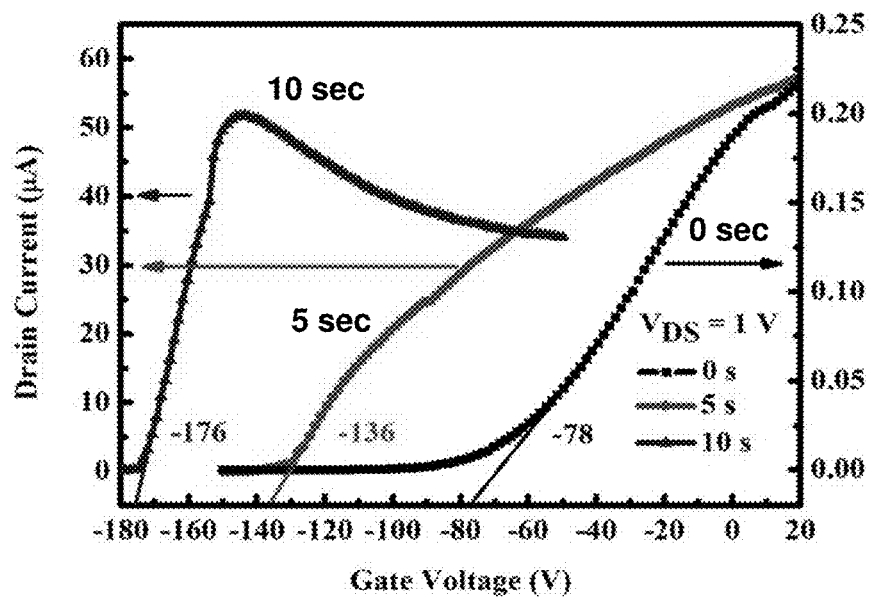
FIG. 5B shows $I_D$-$V_{GS}$ characteristics of FETs using $MoS_2$ layers.

FIG. 5B shows $I_D$-$V_{GS}$ characteristics of FETs using $MoS_2$ layers, as the TMD layer 14. FIG. 5B shows three I-V curves corresponding to different plasma treatment time, 0 sec, 5 sec and 10 sec, respectively.

As shown in FIG. 5B, the threshold voltages ($V_{th}$) of the FET device shift from −78 V to −116 V and −176 V with an increase of the oxygen plasma treatment time (0 sec, 5 sec and 10 sec), which suggest that increasing electron concentrations are obtained in the $MoS_2$ channel after the low-power oxygen plasma treatment.

The field-effect mobility values of the FET device derived from the $I_D$-$V_{GS}$ curves also increase from 0.01, 2.5 to 9.6 $cm^2V^{-1}s^{-1}$ with an increase of the plasma treatment time (0 sec, 5 sec and 10 sec). Also observed in FIG. 5B are decreases of the drain currents with an increase of the gate bias higher than −144 V (in an absolute value) for the device after 10 sec plasma treatment. The phenomenon suggests that here is more electron scattering for the device after 10 sec plasma treatment, which also indicates that electron concentrations increase very rapidly with increasing plasma treatment time.

To explain the phenomenon of the $V_{th}$ shifting and the mobility increasing of the $MoS_2$ FETs after the low-power oxygen plasma treatment, a model is established. The derived field-effect mobility value of the $MoS_2$ FET according to the present embodiments is much lower than that of FETs fabricated by using exfoliated $MoS_2$ flakes. This suggests that a defect density of the grown $MoS_2$ film by the present embodiments should be much higher than the exfoliated films. Assuming the defects on the $MoS_2$ film, such as Mo dangling bonds, act as electron traps for devices, while the short-term and low-power plasma power treatment is not sufficient to etch or damage the film, $O^{2-}$ ions in the plasma gas would be attracted by the defects and form Mo—O bonds. Therefore, with increasing plasma treatment time, more defects will be de-activated. In this case, increasing electron concentrations would induce decreasing threshold voltages. The lowered defect scatterings will result in increasing field-effect mobility values.

Besides the enhancement of mobility values of $MoS_2$ FETs, the change of $V_{th}$ values of the transistors after oxygen plasma treatment suggests that the Fermi level of the $MoS_2$ channel changes. The increase of electron concentration suggests that the Fermi level increases with increasing plasma treatment time. In this case, the work function of the $MoS_2$ channel would decrease. Before the plasma treatment, the linear $I_D$-$V_{DS}$ curve of the device suggests Ohmic contact is obtained between Au/$MoS_2$ interfaces. The work function of gold is 5.1-5.47 eV. The work function of the $MoS_2$ film fabricated by the present methods is measured 5.144 eV. After plasma treatment, the increase of $MoS_2$ work function would form a barrier for electrons. In this case, Shockley contacts would be obtained for $MoS_2$/Au interfaces. The results have demonstrated if metals with smaller work function are used, such as Ag (4.26-4.74 eV), as the electrodes, even better device performances can be obtained for the $MoS_2$ transistors. On the other hand, the other drain currents observed after plasma treatment suggest that the low-power oxygen plasma treatment does not damage the $MoS_2$ film.

Figure 6:
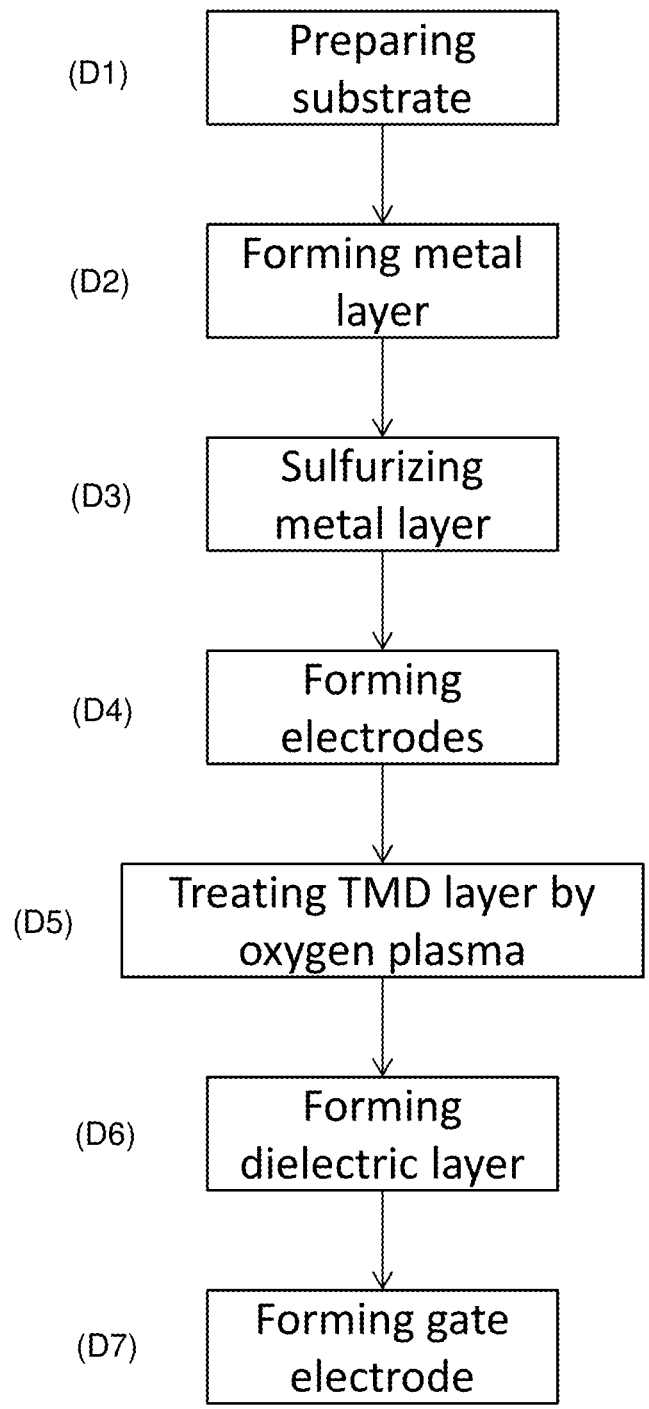
FIG. 6 shows an exemplary flow chart illustrating sequential manufacturing operations for an FET using a TMD material according to another embodiment of the present disclosure.

FIG. 6 shows an exemplary flow chart illustrating sequential manufacturing operations for an FET using a TMD material according to another embodiment of the present disclosure. FIGS. 7A-7E show exemplary schematic views illustrating sequential manufacturing operations for an FET using a TMD material according to another embodiment of the present disclosure. The configurations, structures, materials and/or processes the same as or similar to the foregoing embodiments may be employed in this embodiment and the detailed explanation may be omitted. It is understood that additional operations can be provided before, during, and after processes shown by FIGS. 6 and 7A-7E, and some of the operations described below can be replaced or eliminated, for additional embodiments of the method. The order of the operations/processes may be interchangeable.

In operation D1, a substrate, for example, a sapphire substrate 30 is prepared.

In operation D2, a metal layer, for example, a molybdenum (Mo) layer or a tungsten (W) layer, is formed on the substrate 30. In one embodiment, Mo is formed by using RF sputtering to a thickness of about 0.5 nm to about 1.5 nm.

Figure 7A:
FIGS. 7A-7E show exemplary schematic views illustrating sequential manufacturing operations for an FET using a TMD material according to another embodiment of the present disclosure.

In operation D3, as shown in FIG. 7A, the metal layer is sulfurized to form a TMD layer 34.

Figure 7B:
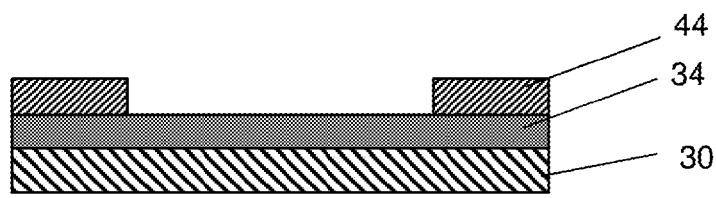

In operation D4, as shown in FIG. 7B, source and drain electrodes 44 are formed on the TMD layer 34. One or more metal material layers made of, for example, Au, Ag and/or Ti, are formed and patterned into a desired shape.

Figure 7C:
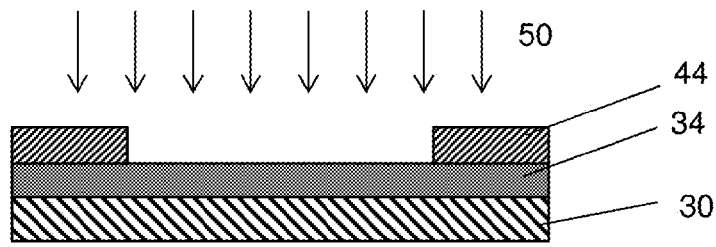

In operation D5, as shown in FIG. 7C, the TMD layer 34 with the electrode 44 is subjected to a low-power plasma treatment 50.

Figure 7D:
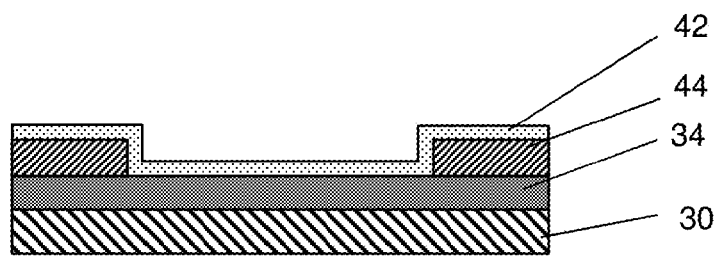

In operation D6, as shown in FIG. 7D, after the plasma treatment, a gate dielectric layer 42 is formed on the TMD layer 34 (and the electrodes 44). The gate dielectric layer 42 is made of, for example, $SiO_2$, $Al_2O_3$, SiON or SiN, formed by using CVD, ALD or PVD. The thickness of the gate dielectric layer is in a range from about 10 nm to about 200 nm in some embodiments.

Figure 7E:
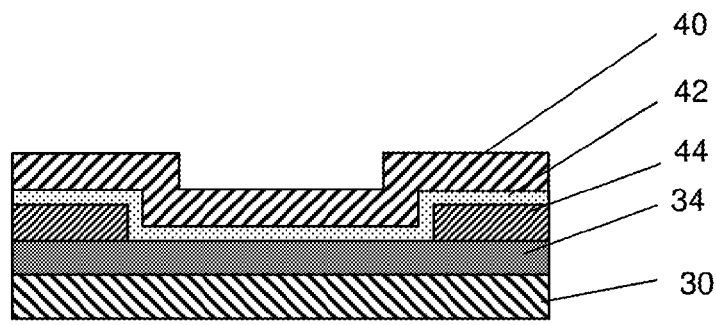

In operation D7, as shown in FIG. 7E, a gate electrode 40 is formed on the gate dielectric layer 42, thereby forming a FET. The gate electrode 40 is made of, for example, poly silicon or metal material, such as Ti, Ta, Cu, or Al. A blanket layer of conductive material is deposited by CVD, ALD or PVD on the gate dielectric layer 42, and patterning operations are performed to obtain the desired gate electrode pattern.

In certain embodiments, the source and drain electrodes 44 are formed after the gate electrode 40 are patterned.

Further, the low-power oxygen plasma treatment may be performed after the sulfurization operation and before the source and drain electrode formation.

In addition, instead of or in addition to the oxygen plasma, plasma using gas, such as $H_2$, $D_2$ and/or $NH_3$, may be utilized to treat the sulfurized metal layer.

Moreover, the TMD layer may be formed by using CVD. For example, a $MoS_2$ layer may be formed on a substrate by using sulfur powder and $MoCl_5$ powder as source materials. The sulfur powder and $MoCl_5$ powder are placed in a furnace and sublimated. The gases of S and $MoCl_5$ are reacted into $MoS_2$ and precipitate on the substrate to form a $MoS_2$ layer.

The various embodiments or examples described herein offer several advantages over the existing art. For example, in the present disclosure, by using a low-power oxygen plasma treatment on the TMD layer, such as a $MoS_2$ layer, it is possible to decrease defects in the $MoS_2$ layer, and to increase carrier mobility in the $MoS_2$ FET.

It will be understood that not all advantages have been necessarily discussed herein, no particular advantage is required for all embodiments or examples, and other embodiments or examples may offer different advantages.

According to one aspect of the present disclosure, in a method of fabricating a field effect transistor, a transition metal dichalcogenide (TMD) layer is formed on a substrate, and the TMD layer is treated with low-power oxygen plasma. An input electric power in the low-power oxygen plasma treatment is in a range from 15 W to 50 W.

According to another aspect of the present disclosure, in a method of fabricating a field effect transistor, a $MoS_2$ layer is formed on a first substrate. A gate dielectric layer is formed on a conductive second substrate. Source and drain electrodes are formed on the gate dielectric layer. The $MoS_2$ layer is detached from the first substrate and attached the detached $MoS_2$ layer on the gate dielectric layer and the source and drain electrodes. The $MoS_2$ layer is treated with low-power oxygen plasma. An input electric power in the low-power oxygen plasma treatment is in a range from 15 W to 50 W.

In accordance with yet another aspect of the present disclosure, in a method of fabricating a field effect transistor, a Mo layer is formed on a substrate. The Mo layer is sulfurized into a $MoS_2$ layer. Source and drain electrodes are formed on the $MoS_2$ layer. The $MoS_2$ layer is treated with low-power oxygen plasma. A gate dielectric layer is formed on the $MoS_2$ layer. A gate electrode is formed on the gate dielectric layer. An input electric power in the low-power oxygen plasma treatment is in a range from 15 W to 50 W.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a field effect transistor, comprising:
   forming a transition metal dichalcogenide (TMD) layer on a substrate; and
   treating the TMD layer with low-power oxygen plasma to reduce defects in the TMD layer by forming metal-oxygen bonds, wherein the low-powered oxygen plasma treating causes an increase in electron concentrations in the TMD layer and an increased field-effect mobility values in the TMD layer,
   wherein an input electric power in the low-power oxygen plasma treatment is in a range from 15 W to 35 W.

2. The method of claim 1, wherein the TMD layer includes at least one of $MoS_2$ and $WS_2$.

3. The method of claim 1, wherein the TMD layer includes $MoS_2$.

4. The method of claim 3, wherein the forming the $MoS_2$ layer includes:
   forming a Mo layer on the substrate; and
   sulfurizing the Mo layer, thereby converting the Mo layer into the $MoS_2$ layer.

5. The method of claim 4, wherein in the sulfurizing the Mo layer, the substrate is heated at a temperature in a range from 700° C. to 900° C.

6. The method of claim 3, wherein the input electric power in the low-power oxygen plasma treatment is in a range from 20 W to 35 W.

7. The method of claim 3, wherein the low-power oxygen plasma treatment is performed for 1 sec to 20 sec.

8. The method of claim 3, wherein the low-power oxygen plasma treatment is performed for 3 sec to 10 sec.

9. The method of claim 6, wherein in the low-power oxygen plasma treatment, a DC bias in a range from 20 V to 40 V is applied to the substrate.

10. A method of fabricating a field effect transistor, comprising:
    forming a $MoS_2$ layer on a first substrate;
    forming a gate dielectric layer on a second conductive substrate;
    forming source and drain electrodes on the gate dielectric layer;
    detaching the $MoS_2$ layer from the first substrate and attaching the detached $MoS_2$ layer on the gate dielectric layer and the source and drain electrodes; and
    treating the $MoS_2$ layer with low-power oxygen plasma, wherein an input electric power in the low-power oxygen plasma treatment is in a range from 15 W to 50 W.

11. The method of claim 10, wherein an input electric power in the low-power oxygen plasma treatment is in a range from 20 W to 35 W.

12. The method of claim 10, wherein the low-power oxygen plasma treatment is performed for 1 sec to 20 sec.

13. The method of claim 10, wherein the low-power oxygen plasma treatment is performed for 3 sec to 10 sec.

14. The method of claim 10, wherein in the low-power oxygen plasma treatment, a DC bias in a range from 20 V to 40 V is applied to the substrate.

15. The method of claim 10, wherein the source and drain electrodes include at least one of Au, Ag and Ti.

16. A method of fabricating a field effect transistor, comprising:
    forming a Mo layer on a substrate;
    sulfurizing the Mo layer into a $MoS_2$ layer;
    forming source and drain electrodes on the $MoS_2$ layer;
    treating the $MoS_2$ layer with low-power oxygen plasma;
    forming a gate dielectric layer on the $MoS_2$ layer; and
    forming a gate electrode on the gate dielectric layer,
    wherein an input electric power in the low-power oxygen plasma treatment is in a range from 15 W to 50 W.

17. The method of claim 16, wherein an input electric power in the low-power oxygen plasma treatment is in a range from 20 W to 35 W.

18. The method of claim 16, the low-power oxygen plasma treatment is performed after the source and drain electrodes are formed and before the gate dielectric layer is formed.

19. The method of claim 16, wherein the low-power oxygen plasma treatment is performed for 1 sec to 20 sec.

20. The method of claim 16, wherein in the sulfurizing the Mo layer, the substrate is heated at a temperature in a range from 700° C. to 900° C.

* * * * *